(12) United States Patent
Feiweier

(10) Patent No.: US 10,353,043 B2
(45) Date of Patent: Jul. 16, 2019

(54) METHOD AND APPARATUS FOR CORRECTION OF MAGNETIC RESONANCE IMAGE DATA

(71) Applicant: Siemens Healthcare GmbH, Erlangen (DE)

(72) Inventor: Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 284 days.

(21) Appl. No.: 15/281,958

(22) Filed: Sep. 30, 2016

(65) Prior Publication Data

US 2017/0090001 A1 Mar. 30, 2017

(30) Foreign Application Priority Data

Sep. 30, 2015 (DE) .................. 10 2015 218 847

(51) Int. Cl.
| | | |
|---|---|---|
| *G01V 3/00* | (2006.01) | |
| *G01R 33/58* | (2006.01) | |
| *G01R 33/54* | (2006.01) | |
| *G01R 33/565* | (2006.01) | |

(52) U.S. Cl.
CPC ........... *G01R 33/58* (2013.01); *G01R 33/543* (2013.01); *G01R 33/565* (2013.01)

(58) Field of Classification Search
CPC .................................................... G01R 33/543
USPC ......................................... 324/309, 307, 314
See application file for complete search history.

(56) References Cited

U.S. PATENT DOCUMENTS

| | | | | |
|---|---|---|---|---|
| 4,591,789 A | | 5/1986 | Glover et al. | |
| 8,604,787 B2 | * | 12/2013 | Posse ..................... | A61B 5/055 |
| | | | | 324/309 |
| 8,963,547 B2 | * | 2/2015 | Tsujita ............... | G01R 33/3875 |
| | | | | 324/322 |
| 9,041,396 B2 | * | 5/2015 | Pfeuffer ............... | G01R 33/243 |
| | | | | 324/307 |
| 2010/0286802 A1 | | 11/2010 | Feiweier et al. | |

(Continued)

FOREIGN PATENT DOCUMENTS

WO WO-2007106360 A1 9/2007

OTHER PUBLICATIONS

Du et al., "Correction of Concomitant Magnetic Field-Induced Image Artifacts in Nonaxial Echo-Planar Imaging", Magnetic Resonance in Medicine, vol. 48, pp. 509-515 (2002).

(Continued)

*Primary Examiner* — Louis M Arana
(74) *Attorney, Agent, or Firm* — Schiff Hardin LLP

(57) ABSTRACT

In a method and apparatus for correction of magnetic resonance image data, at least on environmental conditions map is provided to a computer, measurement data are acquired using a prospective correction method and storage of a first set of correction data, established within the framework of the prospective correction method, is stored. Image data are reconstructed from the recorded measurement data, and a second set of correction data are determined for the created image data and/or the recorded measurement data by a second correction method on the basis of the environmental conditions map and on the basis of the first set of correction data. Corrected image data are generated using the second set of correction data.

10 Claims, 2 Drawing Sheets

(56) References Cited

U.S. PATENT DOCUMENTS

| | | | |
|---|---|---|---|
| 2015/0002149 A1* | 1/2015 | Nehrke | G01R 33/243 324/309 |
| 2015/0160321 A1 | 6/2015 | Patil et al. | |
| 2015/0323637 A1 | 11/2015 | Beck et al. | |
| 2016/0018502 A1* | 1/2016 | Wang | G01R 33/246 324/307 |
| 2016/0091584 A1 | 3/2016 | Feiweier | |
| 2016/0091586 A1 | 3/2016 | Benner et al. | |
| 2016/0091587 A1 | 3/2016 | Benner et al. | |
| 2016/0091588 A1 | 3/2016 | Benner et al. | |
| 2016/0091589 A1 | 3/2016 | Benner et al. | |
| 2016/0091590 A1 | 3/2016 | Benner et al. | |
| 2017/0089996 A1 | 3/2017 | Feiweier | |
| 2017/0242085 A1* | 8/2017 | Koehler | G01R 33/443 |

OTHER PUBLICATIONS

Setsompop et al., "Slice-Selective RF Pulses for In Vivo $B_1+$ Inhomogeneity Mitigation at 7 Tesla Using Parallel RF Excitation With a 16-Element Coil," Magnetic Resonance in Medicine, vol. 60, pp. 1422-1432 (2008).

Meier et al., "Concomitant Field Terms for Asymmetric Gradient Coils: Consequences for Diffusion, Flow, and Echo-Planar Imaging," Magnetic Resonance in Medicine, vol. 60, pp. 128-134 (2008).

Jezzard et al., "Sources of Distortion in Functional MRI Data," Human Brain Mapping, vol. 8, pp. 80-85 (1999).

Cheng et al., "Rapid High-Resolution $T_1$ Mapping by Variable Flip Angles: Accurate and Precise Measurements in the Presence of Radiofrequency Field Inhomogeneity," Magnetic Resonance in Medicine, vol. 55, pp. 566-574 (2006).

Ooi et al., "Combined Prospective and Retrospective Correction to Reduce Motion-Induced Image Misalignment and Geometric Distortions in EPI," Magnetic Resonance in Medicine, vol. 69, pp. 803-811 (2013).

Xu et al., "Prospective and Retrospective High Order Eddy Current Mitigation for Diffusion Weighted Echo Planar Imaging," Magnetic Resonance in Medicine, vol. 70, pp. 1293-1305 (2013).

Lamberton et al., "A New EPI-Based Dynamic Field Mapping Method: Application to Retrospective Geometrical Distortion Corrections," Journal of Magnetic Resonance Imaging, vol. 26, pp. 747-755 (2007).

\* cited by examiner

METHOD AND APPARATUS FOR CORRECTION OF MAGNETIC RESONANCE IMAGE DATA

BACKGROUND OF THE INVENTION

Field of the Invention

The invention concerns a method, a magnetic resonance apparatus, and an electronically-readable data medium for correction of magnetic resonance image data.

Description of the Prior Art

Magnetic resonance (MR) technology is a known modality with which images of the inside of an object under examination can be created. Expressed in simple terms this involves positioning an object to be examined in a magnetic resonance scanner in a strong static, homogeneous basic magnetic field, also called the B0 field, with field strengths from 0.2 Tesla to 7 Tesla and more, so that nuclear spins in the object are oriented along the basic magnetic field. To trigger nuclear magnetic resonances, radio-frequency pulses (RF pulses), for excitation or refocusing, are radiated into the object under examination, and the nuclear magnetic resonance signals that are triggered are measured as so-called k space data. On the basis of the k-space data, MR images are reconstructed or spectroscopy data are established. For spatial encoding of the measurement data, rapidly switched magnetic gradient fields are overlaid on the basic magnetic field. The recorded measurement data are digitized and stored as complex numerical values in a k space matrix. From the k space matrix occupied by values, an associated MR image is able to be reconstructed, by a multi-dimensional Fourier transformation, for example.

All these technical subsystems, e.g. for gradient control and for RF send/receive control, must be accessed in a coordinated way by a control computer. The settings and switchings of the individual subsystems necessary for a specific measurement process must be undertaken at the correct point in time by the activation. Usually the volume to be mapped is recorded, e.g. within an imaging sequence, in sub-volumes, for example with 2D imaging in a number of slices or with 3D imaging in a number of so-called slabs. The sub-volumes thus recorded are then combined into a complete volume. A further definition of sub-volumes can be designated, for example, as Regions of Interest (ROI) or Volumes of Interest (VOI) that are defined specifically by the operator. Furthermore, additional sub-volumes are produced such as in magnetic resonance systems during the definition of local saturation regions or local preparation or labeling pulses.

For this purpose of coordinated activation, sequence control data, primarily based on a measurement protocol, can be transferred to the control computer. This sequence control data define various functional sub-sequences of a complete measurement sequence. For magnetic resonance imaging a first sub-sequence can involve a pulse sequence for example, which locally in a specific area achieves a saturation of specific spins. Further sub-sequences can contain specific preparation pulses, for example, and other sub-sequences are used for successive excitation and for receiving the magnetic resonance signals in different slices or slabs.

In general, methods based on magnetic resonance, especially tomographic imaging (MRT, Magnetic Resonance Tomography) and spectroscopy (MRS, Magnetic Resonance Spectroscopy) need "favorable" physical environmental conditions in order to ensure the best possible quality of the recorded data. For example, this involves at least one of the criteria of spatial homogeneity, temporal stability and absolute accuracy of the magnetic fields B0 (the stationary main magnetic field) and B1 (the magnetic radio-frequency alternating field) relevant for the MR method.

Known measures, with which deviations from ideal environmental conditions can be at least partly compensated, include system-specific settings that seek to correct the circumstances of the MR system used, such as e.g. eddy-current-induced dynamic field disturbances or gradient sensitivities, as well as examination object-specific settings, which attempt to balance out the changes caused by the introduction of the object under examination, e.g. a patient, into the measurement volume of the MR system, such as susceptibility-related static field disturbances or spatial variations of the radio-frequency field.

These types of methods for improving the quality of the recorded measurement data, especially by adjustments, and for dynamic adjustment, of the corresponding measurement parameters, have been further developed in recent years.

A method is described in DE 10 2009 020 661 B4, for example, with which parameters of a measurement sequence, e.g. in the magnetic resonance technology, can be adapted while the measurement sequence is running. In addition it is already described therein that different functional sub-sequences are generally assigned to different effective volumes. This means that for each sub-sequence, a different sub-volume of the overall measurement volume is relevant.

An adaptation of measurement parameters during an ongoing measurement for optimizing the image quality is also described in that document. The basic idea of such a dynamic adjustment is to arrange the physical environmental conditions where possible at each point in time such that they are as ideal as possible for the sub-volume currently relevant in the measurement process. If, for example, during an MR measurement the spins of a slice are excited and thereafter the created signal is detected, then for this time segment of the MR measurement the measurement parameters can be optimized to the region defined by the slice. During a following excitation and detection of the next slice the optimization can then be accordingly dynamically adapted, etc.

The measurement parameters to be adapted can include the mid frequency in the modulation of the radiated RF pulses, the demodulation frequency of the received MR signal, scaling factors of the RF pulse amplitude, amplitude and phase distribution of the RF currents to a number of send elements (where present), B0 shim settings (of first or higher order for example), transmitter scalings, B1 shim settings or also Maxwell compensation settings. As a result of the local environmental conditions optimized at any given point in time of the measurement, the image quality is prospectively significantly improved by such dynamic adjustments—even by comparison with static adjustment settings.

Furthermore MR recording and post-processing methods are known that, on the basis of environmental condition maps established in advance of a diagnostic measurement, make possible a correction of MR images, such as a retrospective correction. The environmental condition maps provide knowledge about the environmental conditions, e.g. in the form of spatially-resolved maps of e.g. the actual field distribution of the basic magnetic field B0 and/or of the radio-frequency alternating field B1. Such methods include, for example, methods for correction of image distortions resulting from basic field inhomogeneities, methods for correcting the influence of Maxwell fields, methods for correction of parameter maps, methods for correction of the influence of gradient non-linearities or also methods for computing optimized (e.g. multi-dimensional) RF pulses. These types of correction methods are frequently needed for example for correction of distortions and other artifacts.

These types of correction method include a correction of susceptibility-related distortions in echo planar imaging (EPI), for example.

EPI methods typically exhibit a very small bandwidth of the pixels in the phase encoding direction (e.g. a few 10 Hz/pixel). Therefore, the mapping fidelity in EPI methods is especially sensitive to (local) variations of the basic magnet field B0. These types of variations (inhomogeneities) can be induced for example by susceptibility differences of different tissue types as well as by the surrounding air.

A number of methods for correction of these types of mapping errors operates on the basis of recorded B0 field maps. As an example, reference can be made to the article by Jezzard et al. "Sources of Distortion in Functional MRI Data", Human Brain Mapping 8, P. 80-85 (1999). These types of field maps are recorded before or during the measurement of the measurement data. Knowledge of the B0 field distribution from the B0 field map successfully enables image distortions to be at least partly reversed by suitable processing steps (see e.g. the said article by Jezzard et al.). Basically similar correction methods are not only applicable for EPI methods, but for all imaging methods that exhibit a high B0 sensitivity, such as e.g. also gradient echo imaging (GRE) with low bandwidth, measurement data acquisition methods with spiral trajectories, etc.

Other methods for correction of these types of mapping error are used for the correction of distortions or of undesired phase errors as a result of Maxwell field terms. These types of distortions or errors arise e.g. during switching of magnetic field gradients for MR imaging, since here, as well as the desired longitudinal components in accordance with the Maxwell equations, undesired (but entirely MR-relevant) cross components also occur. The latter can lead, for example, to distortions in the echo planar imaging, or to additional phase evolutions, which can cause an undesired signal dephasing in diffusion or flow imaging. This problem is described, for example, in the article by Meier et al. "Concomitant Field Terms for Asymmetric Gradient Coils: Consequences for Diffusion, Flow, and Echo-Planar Imaging", Magnetic Resonance in Medicine 60, P. 128-134 (2008).

Methods for correction of these types of Maxwell effects usually operate on the basis of the known relationship between longitudinal magnetic useful field and the associated field deviations, as is described, for example, in the article by Du et al. "Correction of Concomitant Magnetic Field-Induced Image Artifacts in Nonaxial Echo-Planar Imaging", Magnetic Resonance in Medicine 48, P. 509-515 (2002). In this way a map of the effects to be expected can be created for the respective effect of the switched gradient pulses, in order to carry out compensating measures (for example removing distortion from the images) on this basis.

Yet other methods for correction of these types of mapping errors are used to compute RF pulses for localized (e.g. two- or three-dimensional) excitation. These types of specific RF pulses, which are applied simultaneously with an adapted gradient trajectory for example, allow a dedicated excitation of "shaped" areas in the object under examination. In this way, for example, only the desired examination areas can be recorded explicitly or explicitly undesired areas in the object under examination (e.g. parts that move, which can lead to image artifacts) can be saturated and thus suppressed in the final image.

For computing the shape and nature of such RF pulses (on one or more transmitter channels) as well as of the associated gradient pulses, B0 and B1 maps are indispensable as a rule. An example for such a computation is described in the article by Setsompop et al. "Slice-Selective RF Pulses for In Vivo B1+ Inhomogeneity Mitigation at 7 Tesla Using Parallel RF Excitation With a 16-Element Coil", Magnetic Resonance in Medicine 60, P. 1422-1432 (2008). These B0 and B1 maps can be recorded before or during the measurement.

Further methods for correction of these types of mapping error can be used for correction of parameter maps. For example in quantitative MR imaging, instead of grayscale images with undefined scaling, spatially resolved parameter maps (e.g. for T1, T2, T2*) with defined scaling are generated. In a few of the associated recording and computing methods variations in specific environmental parameters lead to errors in the quantification. This is especially the case for variations of the amplitude of the local B1 field of the local flip angle produced thereby.

A number of correction methods for quantitative MR imaging takes into account the information from recorded field maps (e.g. of the B1 field) for rectifying the quantification errors. An example for such a correction method is described in the article by Cheng et al. "Rapid High-Resolution T1 Mapping by Variable Flip Angles: Accurate and Precise Measurements in the Presence of Radiofrequency Field Inhomogeneity", Magnetic Resonance in Medicine 55, P. 566-574 (2006).

Other methods for correction of such mapping errors are used for correction of distortions resulting from non-linearities of the gradient fields. This is because the gradient fields used for the spatial assignment in MR imaging generally (for practical reasons) at least in the edge area of the mapping volume, exhibit deviations from a perfectly linear curve. As a result images in these areas exhibit distortions.

Methods for correction of such distortions generally operate on the basis of the known spatial geometry of the gradient fields. This information is used during image processing in order to assign the recorded data to a corrected spatial position. Such a correction method is described for example in U.S. Pat. No. 4,591,789A1.

All these correction methods however, when applied to MR images that have been created using measurement data acquired from the aforementioned adjustment methods, lead to errors, since the underlying maps under some circumstances are no longer correct as a result of the dynamic adjustments.

SUMMARY OF THE INVENTION

An object of the invention is to use a combination of prospective correction methods, which determine corrections on the basis of previously established environmental conditions maps, and other correction methods, especially the aforementioned retrospective correction methods, and thus to make possible a consistent improvement of the quality of the measurement data and image data without compromises.

An inventive method for correction of magnetic resonance image data has the following steps.

At least one environmental conditions map is created in a computer and MR measurement data are acquired using a prospective correction method, with storage of a first set of correction data established within the framework of the prospective correction method.

Image data are reconstructed from the recorded measurement data.

A second set of correction data for the image data and/or the recorded MR measurement data are determined by a second correction method, preferably a retrospective correction method, on the basis of the at least one created environmental conditions map and on the basis of the first set of correction data.

Corrected image data are generated using the second set of correction data, and made available as a data file.

The underlying knowledge on which the invention is based is that, when the aforementioned second, especially retrospective correction methods, based on previously established environmental conditions maps, are applied, e.g. to MR images, of which the underlying measurement data has been recorded using a prospective correction method, such as e.g. a (dynamic) adjustment method, the results of the second correction method, due the changes made within the framework of the prospective correction method during the acquisition of the underlying measurement data, will be falsified. There are specific errors, especially mapping errors, which cannot be rectified at all retrospectively, but should be prospectively avoided where possible. For example (local) signal dephasings occurring because of B0 field inhomogeneities, which lead to an SNR loss, or (local) signal compressions, which lead to a loss of resolution, cannot be re-established retrospectively. However the are other errors, especially non-linear field deviations, which can only be corrected retrospectively. Therefore it is desirable to be able to combine both correction methods, as is allowed by the present method.

For example, B0 field maps usually applied with retrospective correction methods would not represent the actual relevant environmental conditions for the distortions to be corrected, if within the framework of prospective correction methods e.g. the mid frequency of the RF pulses and/or shim currents (of all orders) has been changed during the recording of the measurement data. Also with retrospective correction methods for correction of Maxwell effects the global relationship between useful field and field deviations is no longer valid when measurement parameters such as the mid frequency of the RF pulses or in their turn shim currents have already been adapted to compensate for Maxwell effects during the measurement of the measurement data. The same also applies to a correction of gradient errors for the maps of the gradient field geometry used, when the gradient fields have been changed within the framework of the prospective correction method. Also B1 field maps employed for retrospective correction methods no longer reflect the relevant environmental conditions, if e.g. the transmitter scaling and/or the B1 shim have already been changed to compensate for B1 inhomogeneities during the acquisition of the measurement data. The corrections carried out in each case with the retrospective correction methods are often erroneous in these cases. Even with a computation of RF pulses for localized excitation this can lead to incorrect excitation profiles.

By taking account of information from the prospective correction method within the framework of the use of a retrospective correction method, the inventive method allows cross dependencies to be taken into account. This enables prospective correction methods to be applied together with retrospective correction methods for correction of image data, without this producing any disadvantage. Also other methods operating on the basis of previously established environmental conditions maps can be combined in such a way with prospective correction methods that the results do not suffer from the changes made within the framework of the prospective correction methods. This enables the quality of the image data ultimately obtained to be significantly improved. In particular this enables environmental conditions-based, especially retrospective, correction methods to be combined with dynamic adjustment methods in the optimum way.

An inventive magnetic resonance apparatus has a scanner with a basic field magnet, a gradient coil arrangement, a radio-frequency antenna and a control computer designed for carrying out the inventive method.

The invention also encompasses an electronically-readable data storage medium encoded with electronically-readable control information (program code) that, when the data medium is loaded in a control computer of a magnetic resonance apparatus, cause the control computer to execute the inventive method.

The aforementioned advantages and embodiments in relation to the method apply analogously to the magnetic resonance apparatus and the electronically-readable data medium.

DESCRIPTION OF THE PREFERRED EMBODIMENTS

Figure 1:
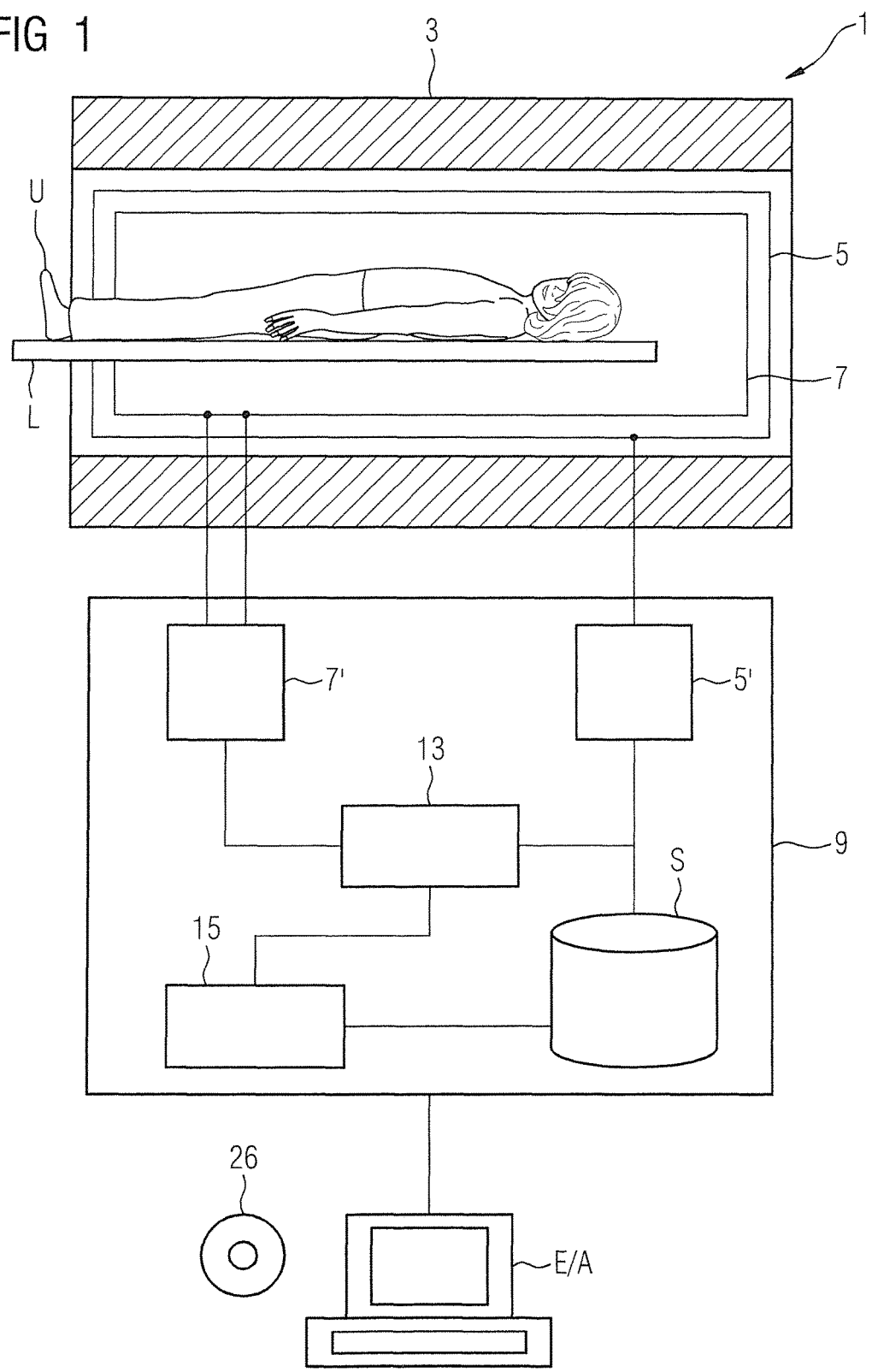
FIG. 1 schematically illustrates an inventive magnetic resonance apparatus.

FIG. 1 schematically shows an inventive magnetic resonance apparatus 1. This has a data acquisition scanner with a basic field magnet 3 for creating the basic magnet field, a gradient coil arrangement 5 for creating the gradient fields, a radio-frequency antenna 7 for emitting and receiving radio-frequency signals, and a control computer 9 designed to carry out the inventive method. In FIG. 1 these subunits of the magnetic resonance apparatus 1 are only shown as rough schematics. For example, the radio-frequency antenna 7 can be composed of a number of subunits, especially a number of coils, which can be embodied for either just sending radio-frequency signals, or for just receiving the emitted radio-frequency signals or for both.

To examine an examination object U, for example a patient or also a phantom, the object can be introduced on a table L into the measurement volume of the scanner.

The control computer 9 serves to control the magnetic resonance apparatus and can especially control the gradient coil arrangement 5 by a gradient controller 5' and the radio-frequency antenna 7 by a radio-frequency send/receive controller 7'. The radio-frequency antenna 7 here can have a number of channels in which respective signals can be sent or received.

The radio-frequency antenna 7 is responsible, together with its radio-frequency send/receive controller 7', for the creation and the emission (sending) of a radio-frequency alternating field for manipulation of the spins in the examination object U. In this case the mid frequency of the radio-frequency alternating field, also referred to as the B1 field, must lie close to the resonant frequency of the spin to be manipulated. To create the B1 field, currents controlled by the radio-frequency send/receive controller 7' are supplied to the radio-frequency antenna 7 (RF coils). For this purpose the radio-frequency send/receive controller 7' includes a frequency synthesizer, which creates a continuous sine-wave current of a specific frequency, the mid frequency.

For this purpose the frequency synthesizer includes an NCO (numerically controlled oscillator), with which the mid frequency can be checked. Also for the receiving and demodulating of the received RF signals, the radio-frequency send/receive controller 7' can use the frequency synthesizer.

Figure 2:
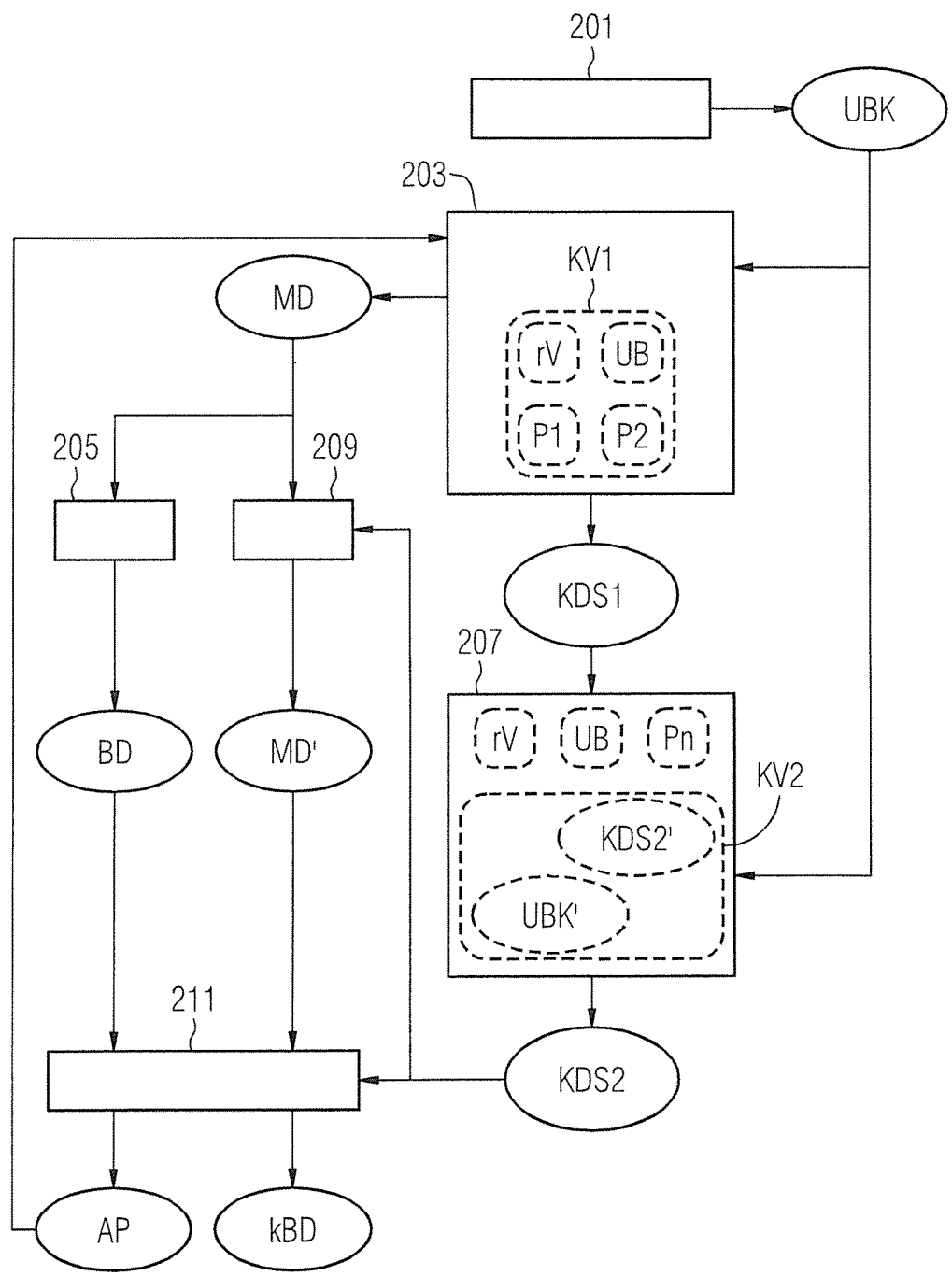
FIG. 2 is a flowchart of the inventive method.

The control computer 9 further has a correction processor 15 designed to carry out the inventive method for correction of image data (cf. FIG. 2). A control processing unit 13 in the control computer 9 is designed to carry out all processing operations needed for the necessary measurements and determinations. Intermediate results needed or established for this can be stored in a memory unit S of the control computer 9. The units shown are not necessarily to be understood as physically separate units, but merely represent a subdivision into logical units that can also be realized in fewer or even in just a single physical unit.

Via an input/output device E/A of the magnetic resonance apparatus, 1 control commands can be directed, e.g. by a user, to the magnetic resonance apparatus and/or results of the control device 9, such as e.g. also corrected image data or also the environmental conditions maps determined can be displayed.

The method described herein can be provided in the form of a computer program, which causes the method to be implemented by the control computer 9 when the program code is executed by the control computer 9. The program code is stored in an electronically-readable data storage medium 26.

FIG. 2 is a flowchart of the inventive method for correction of magnetic resonance image data.

In a step 201 at least one environmental conditions map UBK is created. The environmental conditions map UBK can be, for example, a map of the B0 field distribution, a map of the B1 field distribution, a map of Maxwell effects, or a map of the gradient field geometry. The environmental conditions map UBK may also be a map derived from maps as cited above, such as a map of flip angle distribution derived from a B1 field distribution map. For determination of such an environmental conditions map UBK, an adjustment measurement that can be carried out rapidly, is executed by the magnetic resonance scanner, which establishes the desired environmental parameters and stores them spatially-resolved in a respective environmental conditions map UBK. Such a process is especially used for environmental conditions maps UBK that depend on the respective examination object, such as B0 field maps or B1 field maps, which are expected to differ, depending on the examination object located in the measurement volume. It is also conceivable for the environmental conditions map UBK to be established theoretically. This makes sense primarily for maps of Maxwell field terms, which are able to be derived, for example, on the basis of the coil characteristics of the coils used, Maxwell equations, and gradient pulse amplitudes and directions. The environmental conditions map UBK can also be a predefined, already specified and stored environmental conditions map UBK, which only needs to be loaded. This is especially sensible and efficient for environmental conditions parameters that do not depend on the examination object, such as for maps about the gradient geometry.

In a step 203 measurement data MD are recorded using a prospective correction method KV1 and a first set of correction data KDS1 established within the framework of the prospective correction method KV1 is stored. These types of prospective correction methods KV1, which adapt measurement parameters P1, P2 during the runtime of the measurement sequence with which the measurement data was acquired, in order to achieve an optimization of the measurement sequence, at least in part regions, are known. In particular prospective correction methods KV1 can be used, which carry out pre-processing of the adaptations of the measurement parameters to be made in the course of the measurement sequence before the beginning of the measurement, but also such methods as provide a flexible computation of the adaptations to be made during the runtime of the measurement, or also such prospective correction methods as are combined with methods for acceleration of the acquisition of the measurement data, such as e.g. with so-called slice-multiplexing methods. It is also conceivable for the prospective correction method KV1 to comprise a number of the said prospective correction methods.

Measurement parameters relevant for the sending and/or receiving of the radio-frequency signals, such as the mid frequency of RF pulses or measurement parameters for improving the field distributions such as first or higher-order shim currents are to be considered as measurement parameters to be adapted. Here such prospective correction methods KV1 can be establishing the measurement parameters P1, P2 to be adapted, determinations of current relevant volumes rV, e.g. their location and geometry, in which an optimization is to be achieved, but also determinations of, especially current and/or local environmental conditions UB. Also an environmental conditions map UBK, created in step 201 for example, can be used within the framework of the of the prospective correction method KV1, so that the first set of correction data KDS1 is established within the framework of the prospective correction method KV1 using the at least one environmental conditions map UBK. If the environmental conditions map UBK is thus applied both within the framework of the prospective correction method KV1 and also (further below in the text) within the framework of the second correction method KV2, this represents an especially efficient use of the environmental conditions map UBK. The first set of correction data KDS1 can be information established within the framework of the prospective correction method KV1, especially about adaptations made to measurement parameters P1, P2, used if necessary changed environmental conditions UB and also used relevant volumes rV.

This type of prospective correction method can be a dynamic adjustment method, in which, during the runtime of the measurement sequence with which the measurement data is recorded, settings of the measurement parameters P1, P2 are optimized while taking into account changed environmental conditions UB and/or changed currently relevant measurement volumes rV.

Thus the prospective correction method KV1 could for example optimize the basic magnetic field B0 dynamically during the course of recording the measurement data, in that e.g. for each relevant volume rV, for example each slice to be recorded within the framework of an EPI method, the mid frequency of the RF pulses and/or of the shim currents of first and/or higher order is adapted.

From the recorded measurement data MD already optimized in this way in step 203, in a step 205 image data BD are created. This can be done by a known reconstruction method that includes at least one Fourier transformation.

In a step 207 a second set of correction data KDS2 is determined by a second correction method KV2. This occurs on the basis of the at least one created environmental conditions map UBK and on the basis of the first set of correction data KDS1.

The first information included in the set of correction data, which describe adaptations made to measurement parameters Pn, environmental conditions UB used or possibly changed, and relevant volumes rV that are used, is made available to the second correction method KV2.

In the determination of the second set of correction data KDS2 initially on the basis of the at least one created environmental conditions map UBK, a provisional second set of correction data KDS2' can be created by the second correction method KV2, which is corrected on the basis of the first set of correction data KDS1.

In addition or as an alternative, in the determination of the second set of correction data KDS2, the at least one created environmental conditions map UBK can be initially corrected on the basis of the first set of correction data KDS1 to a corrected environmental conditions map UBK'. This can be done by the information included in the first set of correction data 1 being analyzed with respect to changes of the environmental conditions caused by the prospective correction method KV1 and the environmental conditions map being adapted accordingly in order to compensate for these changes, and on the basis of the at least one corrected environmental conditions map UBK' by the second set of correction data KDS2 being determined by means of the second correction method KV2.

Both for this type of correction of a provisional set of correction data KDS2' and for this type of correction of the at least one environmental conditions map UBK, a determination of effects on the image data BD can included of changes of measurement parameters included in the first set of correction data KDS1, carried out during the runtime of a measurement sequence used for the recording of the measurement data MD. These determined effects can then be used to take account, for example, of corrections already made by the prospective correction method KV1 of measurement data MD and thus of the image data BD created from the measurement data MD, within the framework of the second correction method KV2. The determined effects can also be used on the basis of the determined effects, to correct a provisional second set of correction data KDS2' to a second set of correction data KDS2.

If a number of adjustments have been made within the framework of the prospective correction method KV1, of which the effects are valid during a correction of a provisional second set of correction data KDS2' possibly for the same spatial regions (of the image data ultimately to be corrected), then a common value, e.g. an average value, of these effects can be established, on the basis of which the provisional second set of correction data KDS2 is then corrected.

Retrospective correction methods such as the aforementioned correction methods for correction of distortions, are suitable as the correction method KV2. For example these can serve as methods for correction of susceptibility-related distortions in echo planar imaging, for correction of distortions or undesired phase errors as a result of Maxwell effects, for computation of RF pulses for localized excitation, for correction of parameter maps, especially within the framework of quantitative MR imaging or also for correction of distortions because of non-linearities of the gradient fields. It is also conceivable for the second correction method KV2 to include a number of such correction methods. These can also be applied consecutively, wherein in each case information about corrections already made is transferred to a subsequent correction method and is taken into account in said method.

In any event, by taking account of the first set of correction data KDS1 within the framework of the second correction method KV2, actually relevant environmental conditions can be used in each case as the basis of the correction 209, 211.

For example, the prospective correction method KV1 may have caused the basic magnet field B0 to have been dynamically optimized during the course of recording the measurement data. For each relevant volume rV, for example within the framework of an EPI method, this means each slice to be recorded is individually adapted to the mid frequency of the RF pulses and/or the shim currents of first and/or higher order. This information, included in the first set of correction data KDS1 about the adaptations, can be made available for each relevant volume rV to a second correction method KV2, which is intended retrospectively to correct echo planar image distortions for example.

In step 207, as shown, e.g. initially by the second correction method KV2 on the basis of the at least one environmental conditions map UBK, a provisional second set of correction data KDS2' is determined, which thus has provisional distortion-removal parameters. Subsequently the information included in the first set of correction data KDS1 can be taken into account in the determination of the second set of correction data KDS2. For example in EPI methods a change to the mid frequency has the effect that the image data are shifted in the phase encoding direction. For relevant volumes for which the mid frequency has already been adapted within the framework of the prospective correction method KV1, a residual error—if present—is still to be corrected within the framework of the second correction method KV2. The same applies for other adaptations made within the framework of the prospective correction method KV1. For example, adaptations of the shim currents of the first order have the effect of a scaling, truncation or shifting of the image data depending on the direction of the magnetic field gradients relative to the image orientation. These effects able to be determined from the first set of correction data KDS1 can thus be employed to correct the provisional second set of correction data KDS2' to a second set of correction data KDS2.

It is also possible to use such effects established from the first set of correction data KDS1 on the image data BD of changes of measurement parameters included in the first set of correction data KDS1, made during the runtime of a measurement sequence used for the recording of the measurement data MD, in order on the basis thereof, initially to carry out a correction of the at least one environmental conditions map UBK, in order to obtain a corrected environmental conditions map UBK' that reflects the actual environmental conditions at measurement time. On the basis of a corrected environmental conditions map UBK' obtained in this way, the second set of correction data KDS2 can then be determined by means of the second correction method KV2. In addition or as an alternative such a corrected environmental conditions map UBK' can also be determined on the basis of information included in the first set of correction data KDS1 about actual environmental conditions, e.g. in respective relevant volumes, from an original environmental conditions map UBK within the framework of the prospective correction method KV1.

The second set of correction data KDS2 can already be used in a step 209 to correct the measurement data MD, through which corrected measurement data MD' is obtained.

Finally, in a step 211, using the second set of correction data KDS2, corrected image data kBD is created from the image data BD and/or from the corrected measurement data MD'. The corrected image data kBD is largely free from correctable artifacts. The corrected image data can be displayed for example by the input/output device E/A or stored for later use.

Depending on the second correction method KV2, in step 211, in addition to or instead of corrected image data kBD, excitation profiles AP for specific RF pulses can also be created for example. This can be done on the basis of a corrected environmental conditions map UBK' established as described above, wherein it is also conceivable for the corrected environmental conditions map UBK' to be determined on the basis of a first set of correction data KDS1, which is only intended for a planned recording of measurement data. The excitation profiles AP established in this way can subsequently be used for the planned recording of the measurement data in step 203.

The inventive method thus allows prospective correction methods to be used, provided doing so is technically sensible or possible, for a direct adaptation and thus optimization of the measurement to local inhomogeneities in the environmental conditions even during the acquisition of the measurement data and also to correct local deviations from ideal conditions in the environmental conditions still remaining despite the prospective correction with further, especially retrospective, methods.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for correcting magnetic resonance data comprising:
    providing an environmental conditions map to a computer that describes current environmental conditions in a magnetic resonance data acquisition scanner;
    operating said magnetic resonance data acquisition scanner, while said current environmental conditions exist therein, according to imaging parameters so as to acquire magnetic resonance measurement data, and correcting a first attribute produced in the acquired magnetic resonance measurement data by at least one of said imaging parameters, by applying a prospective correction method in said computer in order to obtain a first set of correction data, and storing said first set of correction data;
    reconstructing image data from the magnetic resonance measurement data;
    in said computer, determining a second set of correction data for a second attribute, that differs from said first attribute produced by said at least on of said imaging parameters on the acquired measurement data, applying a retrospective correction method, using the environmental conditions map and said first set of correction data;
    in said computer, using said second set of correction data to correct said image data, thereby obtaining corrected image data; and
    making the corrected image data available from the computer in electronic form as a datafile.

2. A method as claimed in claim 1 comprising determining said second set of correction data by initially generating a provisional second set of correction data dependent on said at least one environmental conditions map, and correcting the provisional second set of correction data dependent on said first set of correction data, to produce said second set of correction data.

3. A method as claimed in claim 1 comprising determining said second set of correction data by initially correcting the at least one environmental corrections map dependent on said first set of correction data, thereby obtaining at least one corrected environmental conditions map, and determining said second set of correction data dependent on the at least one corrected environmental conditions map.

4. A method as claimed in claim 1 comprising determining said second set of correction data by determining effects on said image data caused by changes of measurement parameters included in said first set of correction data that are made during execution of a measurement sequence implemented by said magnetic resonance data acquisition scanner to acquire said measurement data.

5. A method as claimed in claim 4 comprising determining, as said effects on said image data, effects that involve corrections already made to said image data.

6. A method as claimed in claim 4 comprising determining said second set of correction data by initially determining a provisional second set of correction data, and determining said effects on said image data caused by a correction of said provisional second set of correction data.

7. A method as claimed in claim 4 comprising determining said second set of correction data dependent on said effects caused by a correction of said at least one environmental conditions map.

8. A method as claimed in claim 1 comprising generating said first set of correction data in said prospective correction method using said at least one environmental conditions map.

9. A magnetic resonance apparatus comprising:
    a magnetic resonance data acquisition scanner;
    a computer provided with an environmental conditions map to a computer that describes current environmental conditions in a magnetic resonance data acquisition scanner;
    said computer being configured to operate said magnetic resonance data acquisition scanner, while said current environmental conditions exist therein, according to imaging parameters so as to acquire magnetic resonance measurement data and, to correct a first attribute of the acquired magnetic resonance measurement data (b) by at least one of said imaging parameters, by applying a prospective correction method in said computer in order to obtain a first set of correction data, and storing said first set of correction data;
    said computer being configured to reconstruct image data from the magnetic resonance measurement data;
    said computer being configured to determine a second set of correction data for a second attribute, that differs from said first attribute produced by said at least on of said imaging parameters on the acquired measurement data, by applying a retrospective correction method, using the environmental conditions map and said first set of correction data;
    said computer being configured to use said second set of correction data to correct said image data, thereby obtaining corrected image data; and
    said computer being configured to make the corrected image data available from the computer in electronic form as a datafile.

10. A non-transitory, computer-readable data storage medium encoded with programming instructions, said storage medium being loaded into a control and evaluation computer of a magnetic resonance apparatus that comprises a magnetic resonance data acquisition scanner, said programming instructions causing said control and evaluation computer to:

receive an environmental conditions map to a computer that describes current environmental conditions in a magnetic resonance data acquisition scanner;

operate said magnetic resonance data acquisition scanner, while said current environmental conditions exist therein, according to imaging parameters so as to acquire magnetic resonance measurement data, and correct a first attribute produced in the acquired magnetic resonance measurement data by at least one of said imaging parameters, by applying a prospective correction method in said computer in order to obtain a first set of correction data, and storing said first set of correction data;

reconstruct image data from the magnetic resonance measurement data;

determine a second set of correction data for at least one of the image data and the acquired measurement data, by applying a retrospective correction method, using the environmental conditions map and said first set of correction data;

use said second set of correction data to correct said image data, thereby obtaining corrected image data; and make the corrected image data available from the computer in electronic form as a datafile.

* * * * *